(12) United States Patent
Kwon et al.

(10) Patent No.: US 8,937,980 B2
(45) Date of Patent: Jan. 20, 2015

(54) DISTRIBUTED FEEDBACK-LASER DIODES

(75) Inventors: Oh Kee Kwon, Daejeon (KR); Su Hwan Oh, Daejeon (KR); Young Ahn Leem, Daejeon (KR); O-Kyun Kwon, Daejeon (KR); Young-Tak Han, Daejeon (KR); Yongsoon Baek, Daejeon (KR); Yun C. Chung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 107 days.

(21) Appl. No.: 13/614,280

(22) Filed: Sep. 13, 2012

(65) Prior Publication Data

US 2013/0287054 A1 Oct. 31, 2013

(30) Foreign Application Priority Data

Apr. 25, 2012 (KR) .................. 10-2012-0043378

(51) Int. Cl.
*H01S 5/00* (2006.01)
(52) U.S. Cl.
USPC .................. 372/45.01; 372/43.01; 372/50.1; 372/50.123; 372/50.11; 372/96
(58) Field of Classification Search
CPC ......... H01S 5/12; H01S 5/026; H01S 5/1228; H01S 5/22; H01S 5/06258; H01S 5/227; H01S 5/1231; H01S 5/0654; H01S 5/34313; H01S 5/124; H01S 3/0675; H01S 5/3211; H01S 2301/163; H01S 2301/166
USPC ............... 372/45.01, 96, 43.01, 50.1, 50.123, 372/50.11
See application file for complete search history.

(56) References Cited

U.S. PATENT DOCUMENTS

| 4,794,618 | A  | * | 12/1988 | Mito | 372/96 |
| 5,586,131 | A  | * | 12/1996 | Ono et al. | 372/19 |
| 5,790,581 | A  | * | 8/1998 | Nitta | 372/50.1 |
| 6,411,640 | B1 | * | 6/2002 | Nakanishi | 372/96 |
| 7,606,284 | B2 | * | 10/2009 | Oh et al. | 372/96 |
| 7,949,020 | B2 | * | 5/2011 | Kato | 372/20 |
| 8,068,527 | B2 | * | 11/2011 | Takagi | 372/44.01 |
| 2002/0018503 | A1 | * | 2/2002 | Nakamura | 372/50 |
| 2002/0181518 | A1 | * | 12/2002 | Mizutani | 372/27 |
| 2003/0091086 | A1 | * | 5/2003 | Sahara et al. | 372/50 |
| 2007/0133639 | A1 | * | 6/2007 | Oh et al. | 372/50.11 |
| 2010/0260225 | A1 | * | 10/2010 | Takagi | 372/45.01 |
| 2013/0003771 | A1 | * | 1/2013 | Kwon et al. | 372/50.11 |

OTHER PUBLICATIONS

Masahiro Aoki et al., "InP-Based Reversed-Mesa Ridge-Waveguide Structure for High-Performance Long-Wavelength Laser Diodes", IEEE Journal of Selected Topics in Quantum Electronics, vol. 3, No. 2, pp. 672-683, Apr. 1997.

(Continued)

*Primary Examiner* — Colleen A Matthews
*Assistant Examiner* — Delma R Forde
(74) *Attorney, Agent, or Firm* — Rabin & Berdo, P.C.

(57) ABSTRACT

Distributed feedback-laser diodes are provided. The distributed feedback-laser diode may include a substrate, a lower cladding layer having a grating on the substrate, an active layer disposed on the lower cladding layer, a first upper cladding layer disposed on the active layer, a phase-shift region extending in a first direction on the first upper cladding layer, and a ridge waveguide layer extending in a second direction crossing the first direction on the phase-shift region.

19 Claims, 10 Drawing Sheets

(56) References Cited

OTHER PUBLICATIONS

Haruhisa Soda et al., "Stability in Single Longitudinal Mode Operation in GaInAsP/InP Phase-Adjusted DFB Laser", IEEE Journal of Quantum Electronics, vol. QE-23, No. 6, Jun. 1987.

Oh Kee Kwon et al., "Effects of Asymmetric Grating Structures on Output Efficiency and Single Longitudinal Mode Operation in $\lambda/4$-Shifted DFB Laser", IEEE Journal of Quantum Electronics, vol. 47, No. 9, Sep. 2011.

\* cited by examiner

DISTRIBUTED FEEDBACK-LASER DIODES

CROSS-REFERENCE TO RELATED APPLICATIONS

This U.S. non-provisional patent application claims priority under 35 U.S.C. §119 to Korean Patent Application No. 10-2012-0043378, filed on Apr. 25, 2012, the entirety of which is incorporated by reference herein.

BACKGROUND

The inventive concept relates to optical devices and, more particularly, to single-mode distributed feedback-laser diodes.

A distributed feedback-laser diode (DFB-LD) has been applied to various kinds of high speed optical communication systems because of excellent oscillation properties and modulation properties thereof. The modulation properties of a device may be influenced by resonance properties and parasitic effect of a laser diode. And single mode properties may be closely related to a device structure such as a reflective index of an output facet, a shape of a grating, and/or a coupling coefficient.

The DFB-LD may include an active layer and a grating disposed on or under the active layer. A refractive index or a loss may be periodically repeated on the grating. A laser light may be oscillated with a wavelength satisfying Bragg condition in a effective refractive index change structure (i.e., index-coupled grating) of a waveguide in the DFB-LD. The grating may oscillate the laser light by satisfying a phase-condition at two wavelengths within a stop band. The grating may oscillate two wavelengths in a spectrum of the laser light. Kinds of conventional DFB-LDs having the gratings will be described below.

Firstly, a conventional DFB-LD may have a high reflection (HR) coating and an anti-reflection (AR) coating which are cross-sections of the DFB-LD, respectively. The wavelength of the laser light may be very freely changed depending on the coupling coefficient of the grating, a reflective index of the HR coating, and/or an operation current, so that the conventional DFB-LD may have limited oscillation properties. Thus, since a phase of the grating may be randomly shown in the HR coating facet of the conventional DFB-LD, a yield of the single mode may be about 20% or less.

Secondly, another conventional DFB-LD may include a phase-shift grating which is shifted from a predetermined position in a cavity by a quarter of a wavelength. However, the phase-shift grating may be formed by a high cost apparatus such as an electron-beam lithography apparatus. Thus, productivity may decrease.

Thirdly, still another conventional DFB-LD may include a gain/complex-coupled grating where optical loss or optical gain is changed in a longitudinal direction of the index-coupled grating. However, since an oscillated wavelength is changed by change of the optical loss or the optical gain of a device in the conventional complex-coupled DFB-LD, it is difficult to control an operation wavelength.

SUMMARY

Embodiments of the inventive concept may provide distributed feedback-laser diodes capable of increasing or maximizing a yield of a single mode.

According to embodiments of the inventive concepts, a distributed feedback-laser diode may include: a substrate; a lower cladding layer having a grating on the substrate; an active layer disposed on the lower cladding layer; a first upper cladding layer disposed on the active layer; a phase-shift region extending in a first direction on the first upper cladding layer; and a ridge waveguide layer extending in a second direction crossed the first direction on the phase-shift region.

In some embodiments, the distributed feedback-laser diode may further include: a first etch stop layer disposed under the phase-shift region and the ridge waveguide layer and on the first upper cladding layer.

In other embodiments, the phase-shift region may include: a second upper cladding layer disposed between the first etch stop layer and the ridge waveguide layer; and a second etch stop layer disposed between the second upper cladding layer and the ridge waveguide layer.

In still other embodiments, the first upper cladding layer, the second upper cladding layer, and the ridge waveguide layer may include at least one of InP, AlGaAs, and InGaP.

In even other embodiments, the first and second etch stop layers may include InGaAs.

In yet other embodiments, the distributed feedback-laser diode may further include: a first separate confinement hetero-structure disposed between the active layer and the first upper cladding layer.

In yet still other embodiments, the distributed feedback-laser diode may further include: a first etch stop layer disposed between the first upper cladding layer and the ridge waveguide layer.

In yet still other embodiments, the phase-shift region may include a second separate confinement hetero-structure disposed between the first upper cladding layer and the first etch stop layer.

In yet still other embodiments, the second separate confinement hetero-structure may include InGaAsP or AlGaAs.

In yet still other embodiments, the distributed feedback-laser diode may further include: a second upper cladding layer disposed on the first upper cladding layer and the second separate confinement hetero-structure and under the first etch stop layer.

In yet still other embodiments, the ridge waveguide layer may have a reverse mesa structure.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
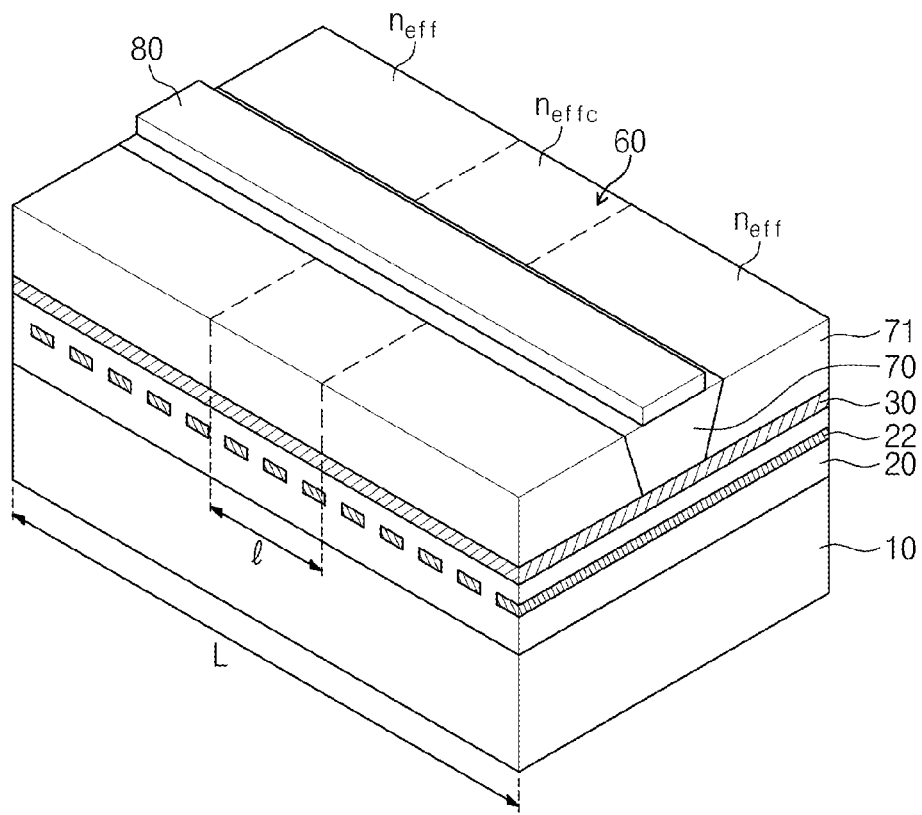
FIG. 1 is a perspective view illustrating a distributed feedback-laser diode according to embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIG. 1 is a perspective view illustrating a distributed feedback-laser diode (DFB-LD) according to embodiments of the inventive concept.

Referring to FIG. 1, a distributed feedback-laser diode (DFB-LD) according to embodiments of the inventive concept may include a phase-shift region 60 extending in a first direction and a ridge waveguide layer 70 extending in a second direction crossing the phase-shift region 60 which are disposed on an active layer 30. The ridge waveguide layer 70 may have a reverse mesa-shape which is narrow at a top surface of the active layer 30 and is wide at a lower surface of an electrode 80. A planarization layer 71 may surround the ridge waveguide layer 70 and the phase-shift region 60. The planarization layer 71 may have a height substantially equal to those of the ridge waveguide layer 70 and the phase-shift region 60. The planarization layer 71 may include a polymer such as polyimide or benzocyclobutene (BCB). The ridge waveguide 70 and the active layer 30 may transmit a laser light along the second direction. The phase-shift region 60 may change a phase of the laser light transmitted along the ridge waveguide layer 70. A first effective refractive index $n_{eff}$ may be applied to the laser light passing through the ridge waveguide layer 70 except the phase-shift region 60. Alternatively, a second effective refractive index $n_{effc}$ different from the first effective refractive index $n_{eff}$ may be applied to the laser light passing through the phase-shift region 60. The laser light may be oscillated in single mode 90 of FIG. 6 by an effective refractive index variation ($\Delta n_{eff} = n_{effc} - n_{eff}$) corresponding to a difference between the first effective refractive index ($n_{eff}$) and the second effective refractive index ($n_{effc}$).

If a predetermined voltage is applied between a substrate 10 and the electrode 80, the laser light having a wavelength corresponding to a space of a grating 22 may be oscillated in the active layer 30. The electrode 80 may be disposed on the ridge waveguide layer 70 so as to extend in the second direction. The grating 22 may be disposed in a lower cladding 20. Each of the lower cladding 20 and the active layer 30 may have a first width L. The phase-shift region 60 may have a second width l smaller than the first width L.

The first width L of the active layer 30 and the laser light may have interrelation represented as the following equation 1.

$$(\beta - \beta_0)L = 2m\pi \pm \pi \qquad \text{[Equation 1]}$$

Here, the "$\beta$" is a propagation-constant. The "$\beta$" may correspond to $2\pi n_{eff}/\lambda$. The "$\lambda$" is an operation wavelength of the laser light. The "$\beta_0$" may correspond to $\pi/\Lambda$. The "$\Lambda$" is a period of the grating 22. The "m" a degree of the grating 22 (m=0, ±1, ±2, ...). The laser light may be generally generated through 0 degree of the grating 22. At this time, the equation 1 may satisfy phase-conditions at $+\pi$ and $-\pi$, respectively. Thus, the lower cladding 20 having the grating 22 and the active layer 30 having the first width L may generate a plurality of laser lights of first and second wavelength bands $\lambda_1$ and $\lambda_2$. The second width l of the phase-shift region 60 corresponding to a phase transition region may have a phase-condition such as the following equation 2.

$$(\beta-\beta_0)L+\Delta\beta l=2m\pi \quad \text{[Equation 2]}$$

Here, the "$\Delta\beta$" may correspond to $2\pi\Delta n_{\it{eff}}/\lambda$. The "$\Delta n_{\it{eff}}$" is the difference between the effective refractive indexes of the phase-shift region 60 and the ridge waveguide 70 ($n_{\it{effc}}-n_{\it{eff}}$). The "$\Delta\beta l$" may correspond to $\pm\pi$. The following equation 3 may be calculated from the equation 1 and the equation 2.

$$l=\lambda/(2|\Delta n_{\it{eff}}|) \quad \text{[Equation 3]}$$

If the effective refractive index variation $\Delta n_{\it{eff}}$ increases, the second width l may be reduced. Alternatively, If the effective refractive index variation $\Delta n_{\it{eff}}$ is reduced, the second width l may increase. For example, the operation wavelength may be 1300 nm, the first effective refractive index $n_{\it{eff}}$ may be 3.25, the period $\Lambda$ of the grating 22 may be 200 nm, and the effective refractive index variation $\Delta n_{\it{eff}}$ may be about $6\times10^{-3}$. In this case, the second width l of the phase-shift region 60 may be about 108 μm. Thus, the phase-shift region 60 may have the second width l in inverse proportion to the effective refractive index variation $\Delta n_{\it{eff}}$. As a result, it is possible to generate the laser light of the single mode 90 at the effective refractive index variation $\Delta n_{\it{eff}}$ of about $6\times10^{-3}$.

Figure 2:
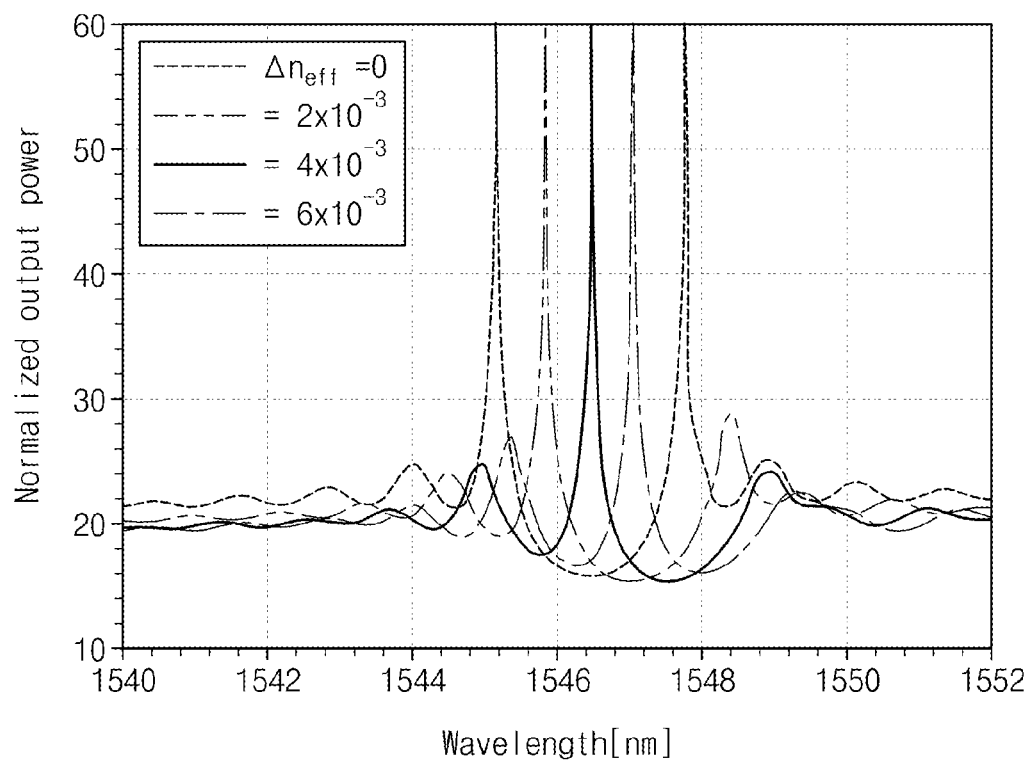
FIG. 2 is a graph illustrating spectrums according to a size of an effective refractive index variation.

FIG. 2 is a graph illustrating spectrums according to a size of an effective refractive index variation.

Referring to FIGS. 1 and 2, if the effective refractive index variation $\Delta n_{\it{eff}}$ of the ridge waveguide layer 70 and the phase-shift region 60 exists, the laser light of the single mode may be generated. If the effective refractive index variation $\Delta n_{\it{eff}}$ does not exist, a laser light of a multi-mode (i.e., a double mode or more) may be generated. A horizontal axis of FIG. 2 represents an oscillation wavelength of the laser light, and a vertical axis of FIG. 2 represents a normalized output power. In the DFB-LD, the first width L may be about 300 μm and the second width l may be about 100 μm. A normalized coupling coefficient is 2. For example, if the effective refractive index variation $\Delta n_{\it{eff}}$ is 0 (zero), the laser lights having wavelengths of about 1545 nm and about 1547.8 nm may be generated. If the effective refractive index variation $\Delta n_{\it{eff}}$ is about $2\times10^{-3}$, the laser light having a wavelength of about 1545.9 nm may be generated. If the effective refractive index variation $\Delta n_{\it{eff}}$ is about $4\times10^{-3}$, the laser light having a wavelength of about 1547 nm may be generated. And if the effective refractive index variation $\Delta n_{\it{eff}}$ is about $6\times10^{-3}$, the laser light having a wavelength of about 1546.5 nm may be generated. Thus, the DFB-LD according to embodiments of the inventive concept may generate the laser light of the single mode when the effective refractive index variation $\Delta n_{\it{eff}}$ is about $6\times10^{-3}$.

The DFB-LD having the effective refractive index variation $\Delta n_{\it{eff}}$ according to embodiments of the inventive concept will be described with reference to embodiments in more detail.

Figure 3:
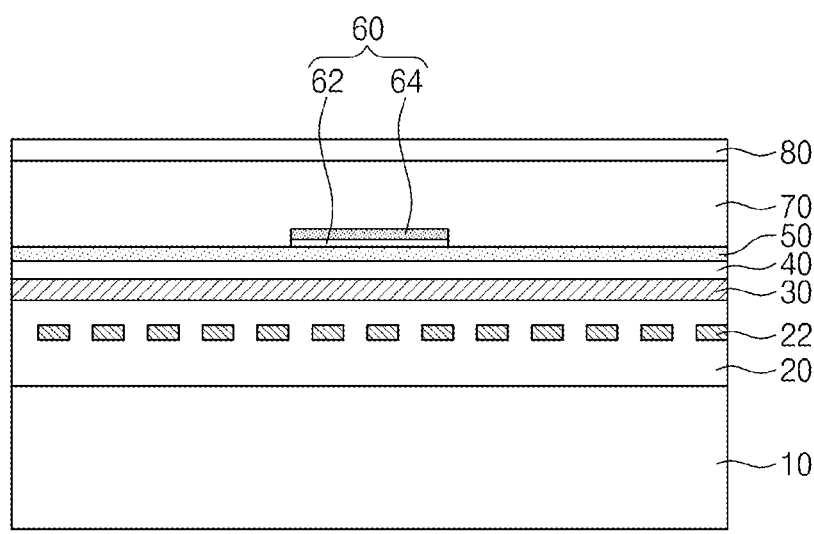
FIG. 3 is a cross-sectional view illustrating a distributed feedback-laser diode according to a first embodiment of the inventive concept.
Figure 4:
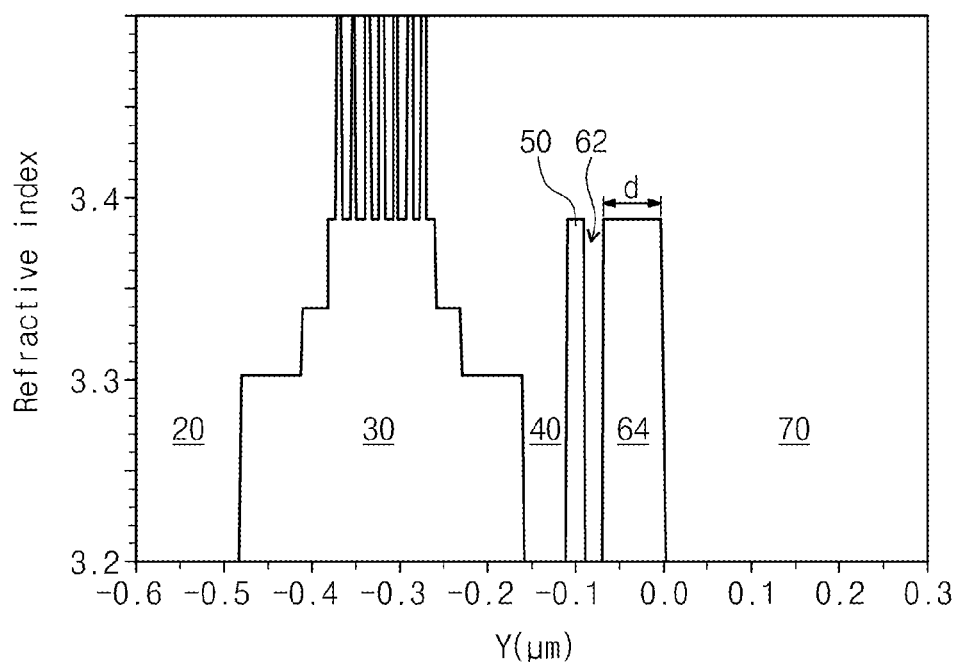
FIG. 4 is a graph illustrating a profile of a refractive index according to a depth based on a second etch stop layer of FIG. 3.

FIG. 3 is a cross-sectional view illustrating a distributed feedback-laser diode according to a first embodiment of the inventive concept. FIG. 4 is a graph illustrating a profile of a refractive index according to a depth based on a second etch stop layer 64 of FIG. 3.

Referring to FIGS. 3 and 4, a DFB-LD according to a first embodiment of the inventive concept may include a substrate 10, a lower cladding layer 20, an active layer 30, a first upper cladding layer 40, a first etch stop layer 50, a phase-shift region 60, a ridge waveguide layer 70, and an electrode 80. The substrate 10 may include InP or GaAs. The lower cladding layer 20 may include InP, AlGaAs, or InGaP. The active layer 30 may include a multiple quantum well structure. The active layer 30 may include InGaAsP, InGaAlAs, AlGaAs, GaAs, and/or InGaAs. The first upper cladding layer 40 may include at least one of InP, AlGaAs, and InGaP. The first etch stop layer 50 may include InGaAs. The phase-shift region 60 may include a second upper cladding layer 62 and a second etch stop layer 64. The second upper cladding layer 62 may have the same material as the first upper cladding layer 40. The second etch stop layer 64 may include the same InGaAs as the first etch stop layer 50. The ridge waveguide layer 70 may include the same material (e.g., InP, AlGaAs, and/or InGaP) as the first upper cladding layer 40.

Each of the first and second upper cladding layers 40 and 62 and the ridge waveguide layer 70 may have a refractive index lower than that of each of the first and second etch stop layers 50 and 64. A horizontal axis of FIG. 4 represents a depth from the lower cladding layer 20 to the ridge waveguide layer 70, and a vertical axis of FIG. 4 represents a refractive index. The phase-shift region 60 may have the second effective refractive index $n_{\it{effc}}$ different from the first effective refractive index $n_{\it{eff}}$ due to the second etch stop layer 64. If the second etch stop layer 64 has a first thickness d of about 50 nm, the effective refractive index variation $\Delta n_{\it{eff}}$ of about 0.006 may be induced with respect to the laser light transmitted along the ridge waveguide layer 70. When the effective refractive index variation $\Delta n_{\it{eff}}$ with respect to the laser light is about 0.006, The phase-shift region 60 may provide the high yield single mode 90.

Thus, the DFB-LD according to the first embodiment of the inventive concept may increase or maximize the yield of the single mode.

Figure 5:
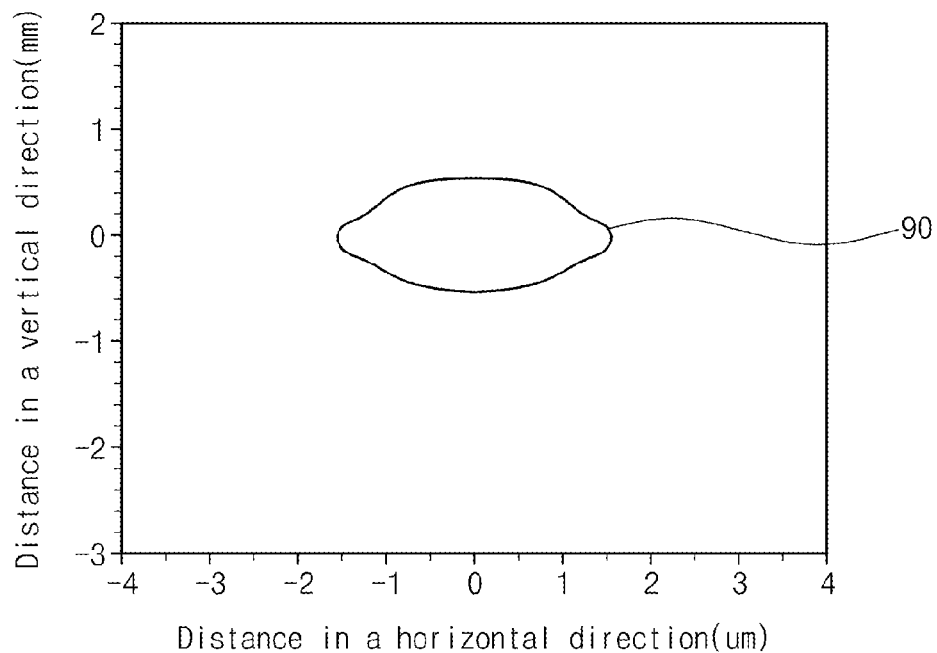
FIGS. 5 and 6 are diagrams illustrating guided modes of laser lights generated from a distributed feedback-laser diode according to embodiments of the inventive concept.
Figure 6:
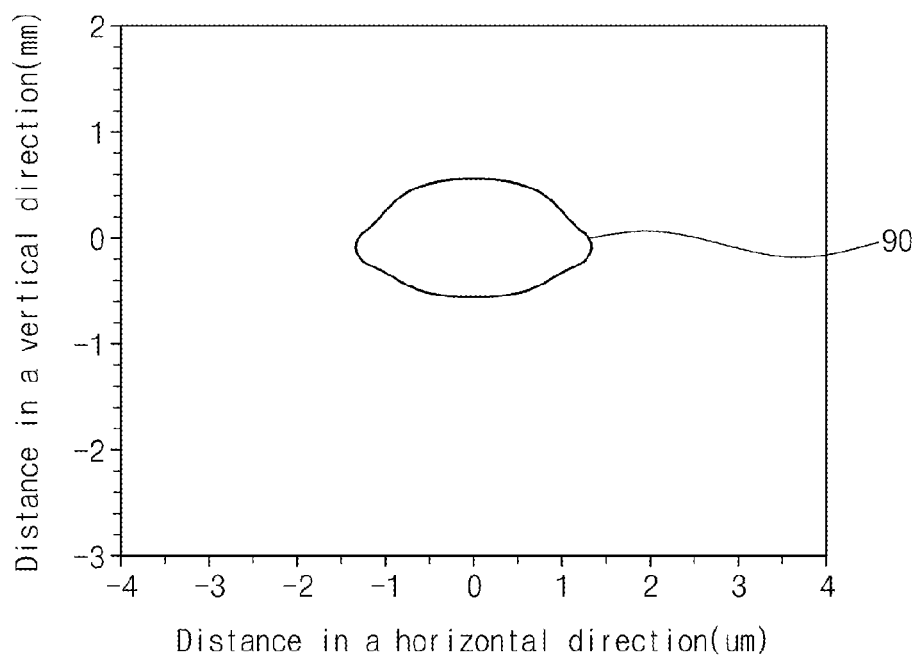

FIGS. 5 and 6 are diagrams illustrating guided modes of laser lights generated from a distributed feedback-laser diode according to embodiments of the inventive concept.

Referring to FIG. 5, if the second etch stop layer 64 is removed (i.e., the thickness of the second etch stop layer 64 is 0(zero)), a guided mode may include a thinly broadened single mode 90. In this case, the first and second effective refractive indexes $n_{\it{eff}}$ and $n_{\it{effc}}$ may be the same as each other (e.g., about 3.2553).

Alternatively, referring to FIG. 6, if the second etch stop layer 64 has a thickness about 120 nm according to the first embodiment of the inventive concept, the guided mode may include a widely concentrated single mode 90 in a center direction. At this time, the first effective refractive index $n_{\it{eff}}$ is about 3.2553, and the second effective refractive index $n_{\it{effc}}$ is about 3.2697. When the second etch stop layer 64 has the first thickness d of about 120 nm, the effective refractive index variation $\Delta n_{\it{eff}}$ with respect to the laser light may be about 0.0144.

Figure 7:
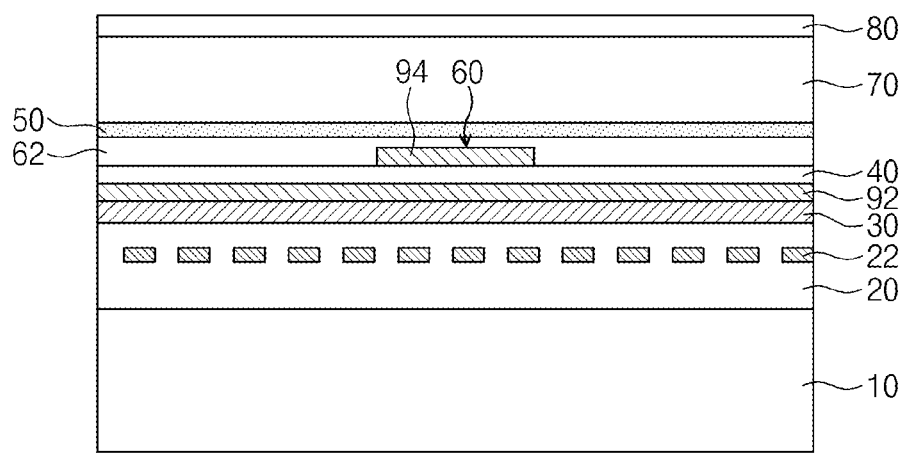
FIG. 7 is a cross-sectional view illustrating a distributed feedback-laser diode according to a second embodiment of the inventive concept.
Figure 8:
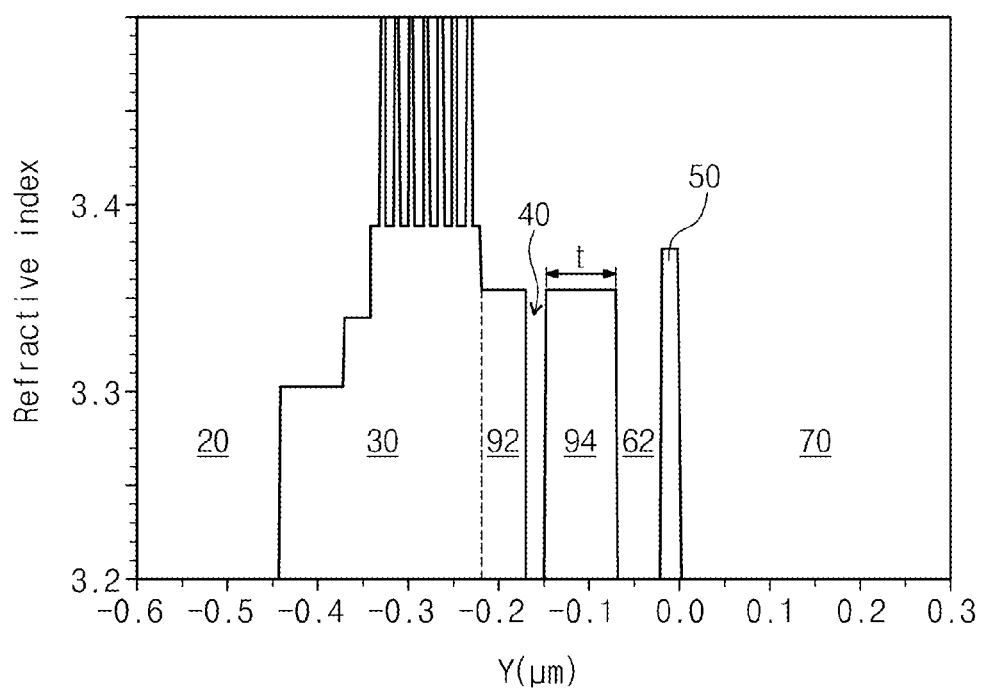
FIG. 8 is a graph illustrating a profile of a refractive index according to a depth based on a first etch stop layer of FIG. 7.

FIG. 7 is a cross-sectional view illustrating a distributed feedback-laser diode according to a second embodiment of the inventive concept. FIG. 8 is a graph illustrating a profile of a refractive index according to a depth based on a first etch stop layer of FIG. 7.

Referring to FIGS. 7 and 8, a DFB-LD according to a second embodiment of the inventive concept may include a first separate confinement hetero-structure 92 disposed between the active layer 30 and the first upper cladding layer 40 and a second separate confinement hetero-structure 94 disposed between the first upper cladding layer 40 and the second upper cladding layer 62. The active layer 30 may include InGaAsP, InGaAlAs, AlGaAs, GaAs, and/or InGaAs which constitute a multiple quantum well structure. The first separate confinement hetero-structure 92 may be formed of the same material as the active layer 30. The second separate confinement hetero-structure 94 may include InGaAsP or AlGaAs. The second separate confinement hetero-structure 94 may be disposed under the first etch stop layer 50. The second separate confinement hetero-structure 94 may constitute the phase-shift region 60 disposed between the active layer 30 and the ridge waveguide layer 70. The second separate confinement hetero-structure 94 may induce the effective refractive index variation $\Delta n_{eff}$ with respect to the laser light transmitted along the ridge waveguide layer 70. The second upper cladding layer 62 may be disposed between the second separate confinement hetero-structure 94 and the first etch stop layer 50.

The second effective refractive index $n_{effc}$ of the phase-shift region 60 may be changed depending on a thickness of the second separate confinement hetero-structure 94. A horizontal axis of FIG. 8 represents a depth from the lower cladding layer 20 to the ridge waveguide layer 70, and a vertical axis of FIG. 8 represents a refractive index. The ridge waveguide layer 70 may have the first effective refractive index $n_{eff}$ with respect to the laser light generated in the active layer 30 outside the phase-shift region 60. The phase-shift region 60 may have the second effective refractive index $n_{effc}$ different from the first effective refractive index $n_{eff}$. When the second separate confinement hetero-structure 94 has a second thickness t of about 30 nm, it may induce the effective refractive index variation $\Delta n_{eff}$ of about 0.006. If the effective refractive index variation $\Delta n_{eff}$ with respect to the laser light is about 0.006, the second separate confinement hetero-structure 94 may provide the high yield single mode 90.

Thus, the DFB-LD according to the second embodiment of the inventive concept may increase or maximize the yield of the single mode.

Figure 9:
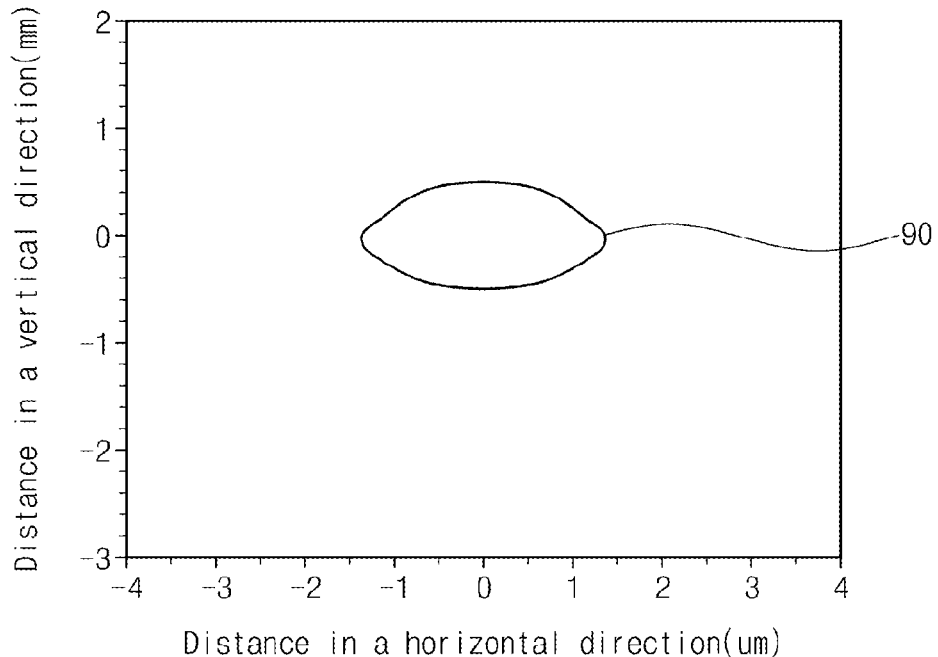
FIGS. 9 and 10 are diagrams illustrating guided modes of laser lights generated from a distributed feedback-laser diode according to embodiments of the inventive concept.
Figure 10:
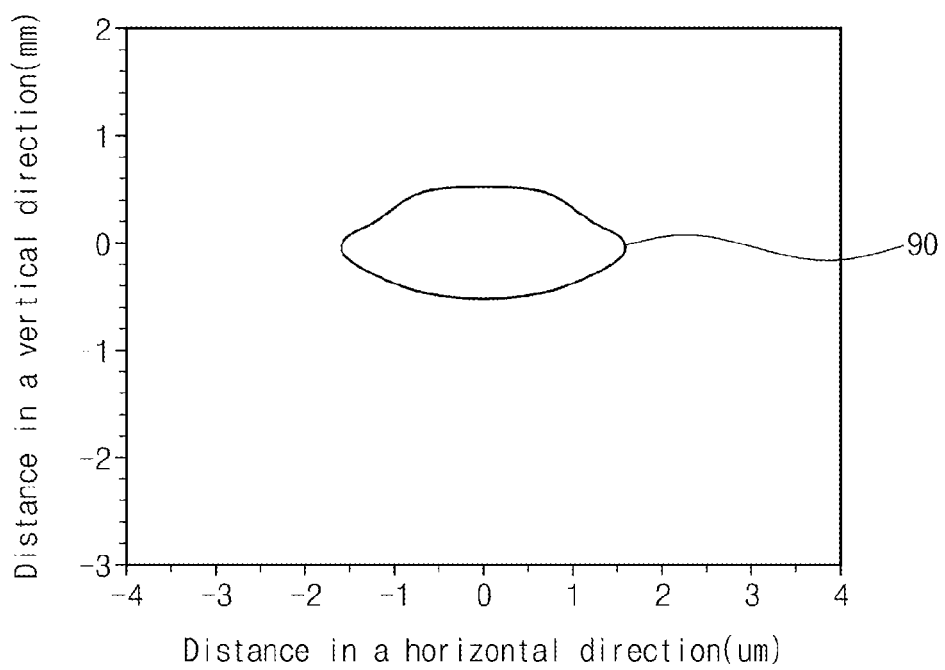

FIGS. 9 and 10 are diagrams illustrating guided modes of laser lights generated from a distributed feedback-laser diode according to embodiments of the inventive concept.

Referring to FIGS. 9 and 10, guides modes according to the inventive concept may be generated from the DFB-LDs including the second separate confinement hetero-structures 94 having the second thicknesses t of about 0 nm and about 80 nm. If the second separate confinement hetero-structures 94 is removed, the guided mode may have the first and second effective refractive indexes $n_{eff}$ and $n_{effc}$ equal to each other (e.g., about 3.251). If the second separate confinement hetero-structures 94 has the thickness of about 80 nm, the guided mode may have the first effective refractive index $n_{eff}$ of about 3.251 and the second effective refractive index $n_{effc}$ of about 3.266. Here, the effective refractive index variation $\Delta n_{eff}$ may be about 0.015. According to the second embodiment, the second separate confinement hetero-structure 94 having the second thickness t of about 30 nm may induce the effective refractive index variation $\Delta n_{eff}$ of about 0.006.

A conventional DFB-LD may have a low light output by high longitudinal spatial hole burning (LSHB). On the other hand, the DFB-LD according to embodiments of the inventive concept may realize a high light output by low LSHB.

Figure 11:
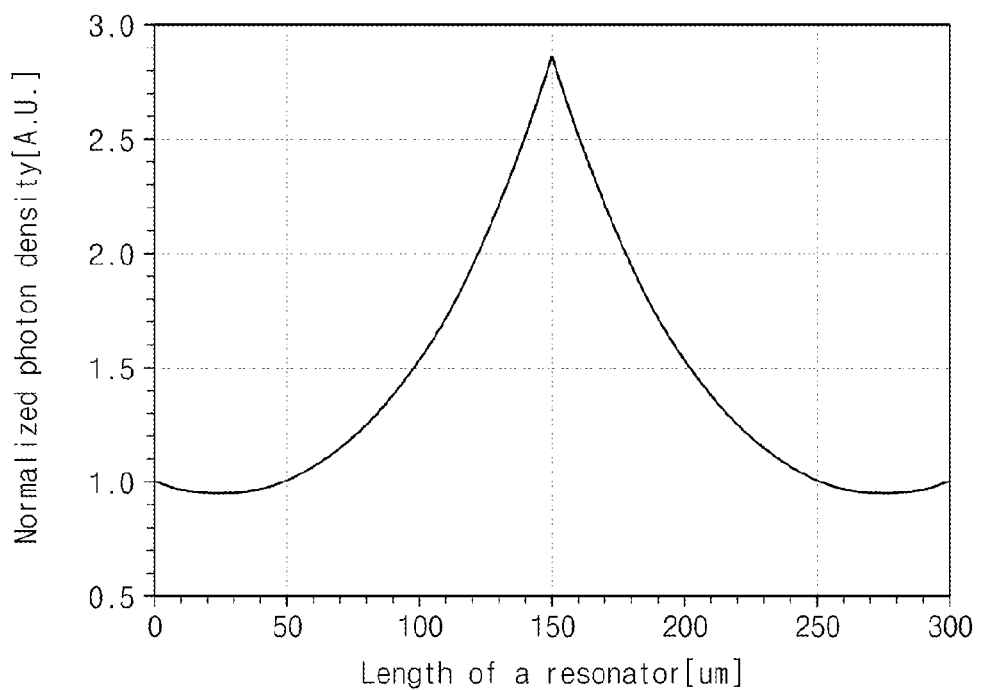
FIGS. 11 and 12 are graphs illustrating photon density distributions of a conventional distributed feedback-laser diode and a distributed feedback-laser diode according to embodiments of the inventive concept, respectively.
Figure 12:
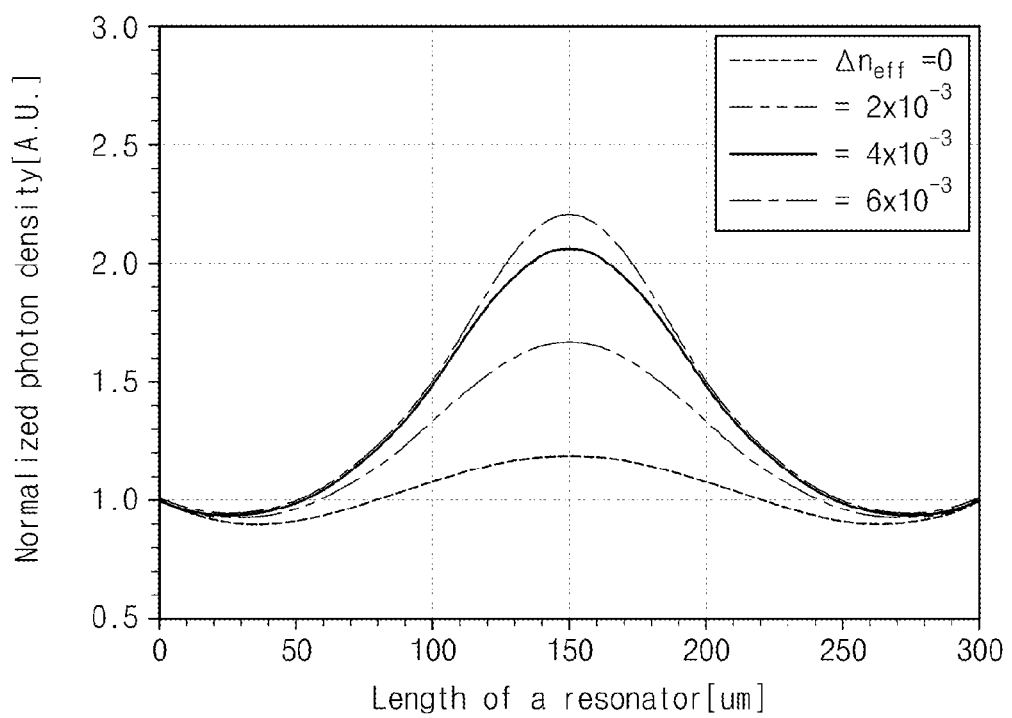

FIGS. 11 and 12 are graphs respectively illustrating photon density distributions of a conventional distributed feedback-laser diode and a distributed feedback-laser diode according to embodiments of the inventive concept in a resonator which are obtained using a laser diode analysis tool when the coupling coefficients of the gratings are equal to each other. Here, a horizontal axis represents a length of a resonator and a vertical axis represents a normalized photon density.

Referring to FIG. 11, the conventional DFB-LD shows a photon density difference of about 2.8 times in a resonator (not shown) having a length of about 300 μm. The photon density difference may increase the LSHB to deteriorate laser oscillation properties.

Referring to FIG. 12, the DFB-LD according to the inventive concept shows the photon density difference within a range of about 1.3 times to about 2.2 times in a resonator (not shown) having a length of about 300 μm. In other words, the photon density difference of the DFB-LD according to the inventive concept may be smaller than that of the conventional DFB-LD. Thus, it is possible to improve the single mode properties of the DFB-LD according to the inventive concept As a result, the DFB-LD according to embodiments of the inventive concept may increase or maximize the yield of the single mode.

As described above, according to embodiments of the inventive concept, the DFB-LD may include the region having the effective refractive index with respect to the laser light generated from the active layer on the active layer. The phase condition of the DFB-LD according to embodiments of the inventive concept may be changed to improve the yield of the single mode.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A distributed feedback-laser diode comprising:
   a substrate;
   a lower cladding layer having a grating on the substrate;
   an active layer disposed on the lower cladding layer;
   a first upper cladding layer disposed on the active layer;
   a phase-shift region extending in a first direction on a side of the first upper cladding layer opposing the active layer; and
   a ridge waveguide layer extending in a second direction crossing the first direction on the phase-shift region.

2. The distributed feedback-laser diode of claim 1, further comprising:
   a first separate confinement hetero-structure disposed between the active layer and the first upper cladding layer.

3. The distributed feedback-laser diode of claim 2, further comprising:
   a first etch stop layer disposed between the first upper cladding layer and the ridge waveguide layer.

4. The distributed feedback-laser diode of claim 3, wherein the phase-shift region includes a second separate confinement hetero-structure disposed between the first upper cladding layer and the first etch stop layer.

5. The distributed feedback-laser diode of claim 4, wherein the second separate confinement hetero-structure includes InGaAsP or AlGaAs.

6. The distributed feedback-laser diode of claim 4, further comprising:

a second upper cladding layer disposed on the first upper cladding layer and the second separate confinement hetero-structure and under the first etch stop layer.

7. The distributed feedback-laser diode of claim 1, wherein the ridge waveguide layer has a reverse mesa structure.

8. The distributed feedback-laser diode of claim 1, wherein the active layer has a multiple quantum well structure.

9. The distributed feedback-laser diode of claim 1, further comprising:
 a planarization layer surrounding the ridge waveguide layer and the phase-shift region.

10. The distributed feedback-laser diode of claim 9, wherein the planarization layer includes polyimide or benzocyclobutene (BCB).

11. The distributed feedback-laser diode of claim 1, further comprising:
 an electrode extending in the first direction on the ridge waveguide layer.

12. A distributed feedback-laser diode comprising:
 a substrate;
 a lower cladding layer having a grating on the substrate;
 an active layer disposed on the lower cladding layer;
 a first upper cladding layer disposed on the active layer;
 a first separate confinement hetero-structure disposed between the active layer and the first upper cladding layer;
 a phase-shift region extending in a first direction on the first upper cladding layer;
 a ridge waveguide layer extending in a second direction crossing the first direction on the phase-shift region; and
 a first etch stop layer disposed between the first upper cladding layer and the ridge waveguide layer,
 wherein the phase-shift region includes a second separate confinement hetero-structure disposed between the first upper cladding layer and the first etch stop layer.

13. The distributed feedback-laser diode of claim 12, wherein the second separate confinement hetero-structure includes InGaAsP or AlGaAs.

14. The distributed feedback-laser diode of claim 12, further comprising:
 a second upper cladding layer disposed on the first upper cladding layer and the second separate confinement hetero-structure and under the first etch stop layer.

15. The distributed feedback-laser diode of claim 12, wherein the ridge waveguide layer has a reverse mesa structure.

16. The distributed feedback-laser diode of claim 12, wherein the active layer has a multiple quantum well structure.

17. The distributed feedback-laser diode of claim 12, further comprising:
 a planarization layer surrounding the ridge waveguide layer and the phase-shift region.

18. The distributed feedback-laser diode of claim 17, wherein the planarization layer includes polyimide or benzocyclobutene (BCB).

19. The distributed feedback-laser diode of claim 12, further comprising:
 an electrode extending in the first direction on the ridge waveguide layer.

* * * * *